(12) United States Patent
Hoffman et al.

(10) Patent No.: US 6,704,391 B2
(45) Date of Patent: Mar. 9, 2004

(54) SYSTEM AND METHOD OF ALIGNING SCINTILLATOR CRYSTALLINE STRUCTURES FOR COMPUTED TOMOGRAPHY IMAGING

(75) Inventors: David M. Hoffman, New Berlin, WI (US); Haochuan Jiang, Brookfield, WI (US)

(73) Assignee: GE Medical Systems Global Technology Co., LLC, Waukesha, WI (US)

(*) Notice: Subject to any disclaimer, the term of this patent is extended or adjusted under 35 U.S.C. 154(b) by 0 days.

(21) Appl. No.: 10/063,235

(22) Filed: Apr. 2, 2002

(65) Prior Publication Data

US 2002/0196897 A1 Dec. 26, 2002

Related U.S. Application Data

(62) Division of application No. 09/681,067, filed on Dec. 19, 2000.

(51) Int. Cl.[7] ................................................. H05G 1/64
(52) U.S. Cl. ........................... 378/98.8; 378/4; 378/19; 378/91
(58) Field of Search .................. 378/4, 19, 91, 378/98.8; 250/214 VT, 367, 363.02; 117/81, 83, 901, 101

(56) References Cited

U.S. PATENT DOCUMENTS 4,365,155 A * 12/1982 Oi et al. ............... 250/370.11
4,725,734 A * 2/1988 Nishiki ....................... 250/366
5,484,750 A * 1/1996 Greskovich et al. ........... 501/86
6,181,767 B1   1/2001 Harootian ..................... 378/19
6,302,959 B2 * 10/2001 Srivastava et al. ............. 117/81
6,585,913 B2 * 7/2003 Lyons et al. ............. 252/301.5

FOREIGN PATENT DOCUMENTS

DE     197 50 337 A 1    6/1998
JP        05093780       4/1993
JP        09080158       3/1997

* cited by examiner

Primary Examiner—Edward J. Glick
Assistant Examiner—Therese Barber
(74) Attorney, Agent, or Firm—Ziolkowski Patent Solutions Group, LLC; Michael A. Della Penna; Carl B. Horton

(57) ABSTRACT

The present invention discloses a method of aligning scintillator crystalline structures for computed tomography imaging and a system of use. Crystal seeds are deposited inside a glass melt and are then grown to form a plurality of layer crystallites. While growing the crystallites, a field is applied to align each crystallite structure in a uniform orientation. As a result, the crystallites are configured to reduce light scattering and improve the overall efficiency of the CT system. A CT system is disclosed implementing a scintillator array having a plurality of scintillators, each scintillator being formed of a plurality of uniformly aligned crystallites. Each crystallite includes a receiving surface and an exiting surface configured perpendicular to an x-ray beam. Further, the receiving surface and the exiting surface are connected by a plurality of surface walls arranged parallel to the x-ray beam.

28 Claims, 4 Drawing Sheets

SYSTEM AND METHOD OF ALIGNING SCINTILLATOR CRYSTALLINE STRUCTURES FOR COMPUTED TOMOGRAPHY IMAGING

BACKGROUND OF INVENTION

The present invention relates generally to the detection and conversion of high frequency electromagnetic energy to electrical signals and, more particularly, to a method of aligning scintillator crystalline structures and a system of use.

Typically, in computed tomography (CT) imaging systems, an x-ray source emits a fan-shaped beam toward an object, such as a patient. The beam, after being attenuated by the object, impinges upon an array of radiation detectors. The intensity of the attenuated beam of radiation received at the detector array is typically dependent upon the attenuation of the x-ray beam by the object. Each detector element of the detector array produces a separate electrical signal indicative of the attenuated beam received by each detector element. The electrical signals are transmitted to a data processing system for analysis which ultimately results in the formation of an image.

Generally, the x-ray source and the detector array are rotated about the gantry within an imaging plane and around the object. X-ray sources typically include x-ray tubes, which emit the x-ray beam at a focal point. X-ray detectors typically include a collimator for collimating x-ray beams received at the detector, a scintillator for converting x-rays to light energy adjacent the collimator, and photodiodes for receiving the light energy from the adjacent scintillator.

Typically, a ceramic scintillator of a CT system is formed by a large number of small crystalline structures or crystallites. The chemical compound used to form the scintillator material generally defines a particular crystalline structure or geometrical shape of each crystallite. Regardless of geometrical shape, in some known scintillators, the crystallites are not optimally aligned. In these known scintillators, the orientation of the crystallites is not sufficiently controlled thereby increasing light scattering. Moreover, in known CT systems, the light receiving surface of each crystallite is not parallel to the structure's light exiting surface, thereby increasing light scattering further and decreasing the overall efficiency of the scintillator detector and the CT system.

It would therefore be desirable to design a scintillator with properly aligned and orientated crystallites that reduces light scattering and improves detector and CT system efficiency.

BRIEF DESCRIPTION OF INVENTION

The present invention provides a detector for a CT system that overcomes the aforementioned drawbacks. The detector includes a scintillator for receiving and converting high frequency electromagnetic energy to light energy. The scintillator includes a plurality of crystallites that are aligned parallel to a high frequency electromagnetic energy beam. Properly aligning the crystallites of the scintillator improves the efficiency of the CT system.

In accordance with one aspect of the invention, a method for orientating crystallites in CT scintillators is provided. The method includes melting a composition configured to convert high frequency electromagnetic energy to light energy into a glass melt. The glass melt is then shaped into one of a number of geometrical configurations depending upon the particular CT system. After shaping the glass melt, crystal seeds are deposited inside the glass melt. The method further includes growing crystallites in the glass melt from the crystal seeds and applying a field to the glass melt while growing the crystallites.

In accordance with another aspect of the invention, a method of CT imaging includes providing a plurality of scintillators forming a scintillator array wherein each scintillator includes a plurality of crystallites. The method further includes the step of aligning the crystallites of each scintillator in a uniform direction to receive high frequency electromagnetic energy from a projection source. The projection source directs high frequency electromagnetic energy toward the scintillator array wherein the high frequency electromagnetic energy is converted to light energy. The method also includes transmitting signals indicative of light energy intensity to a data acquisition system and generating a CT image from the transmitted signals.

In accordance with yet another aspect of the invention, a CT system implementing a plurality of scintillators having a plurality of uniformly aligned crystallites- is provided. The system has a high frequency electromagnetic energy projection source configured to project a high frequency electromagnetic energy beam toward the plurality of scintillators. A photodiode array having a plurality of photodiodes and optically coupled to the plurality of scintillators is provided to receive light energy output from the plurality of scintillators. The system further includes a gantry having an opening to receive a subject object.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

The operating environment of the present invention is described with respect to a four-slice computed tomography (CT) system. However, it will be appreciated by those of ordinary skill in the art that the present invention is equally applicable for use with single-slice or other multi-slice configurations. Moreover, the present invention will be described with respect to the detection and conversion of x-rays. However, one of ordinary skill in the art will further appreciate, that the present invention is equally applicable for the detection and conversion of other high frequency electromagnetic energy.

Figure 1:
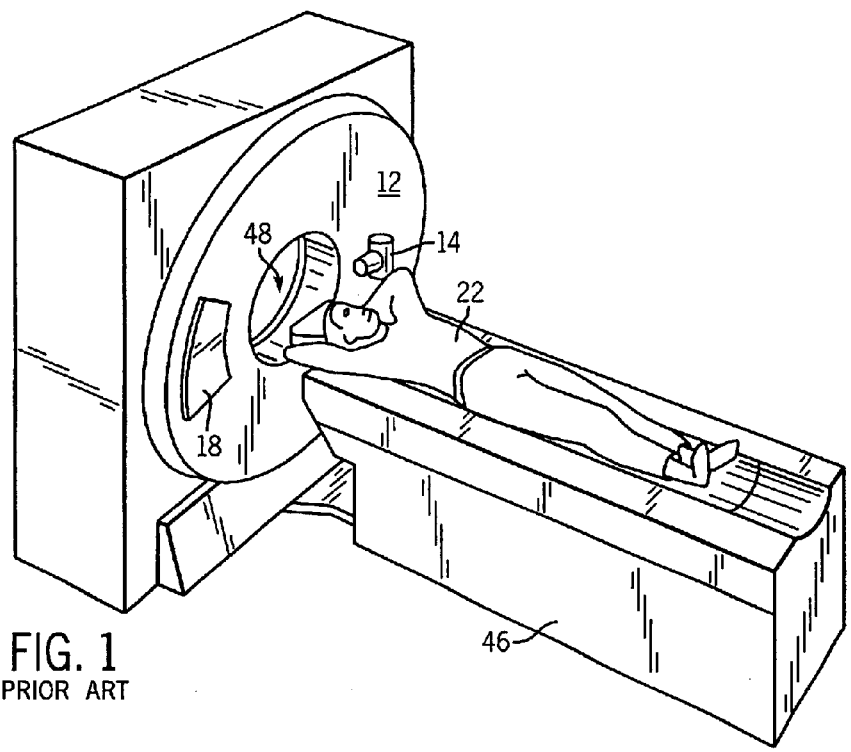
FIG. 1 is a pictorial view of a CT imaging system.
Figure 2:
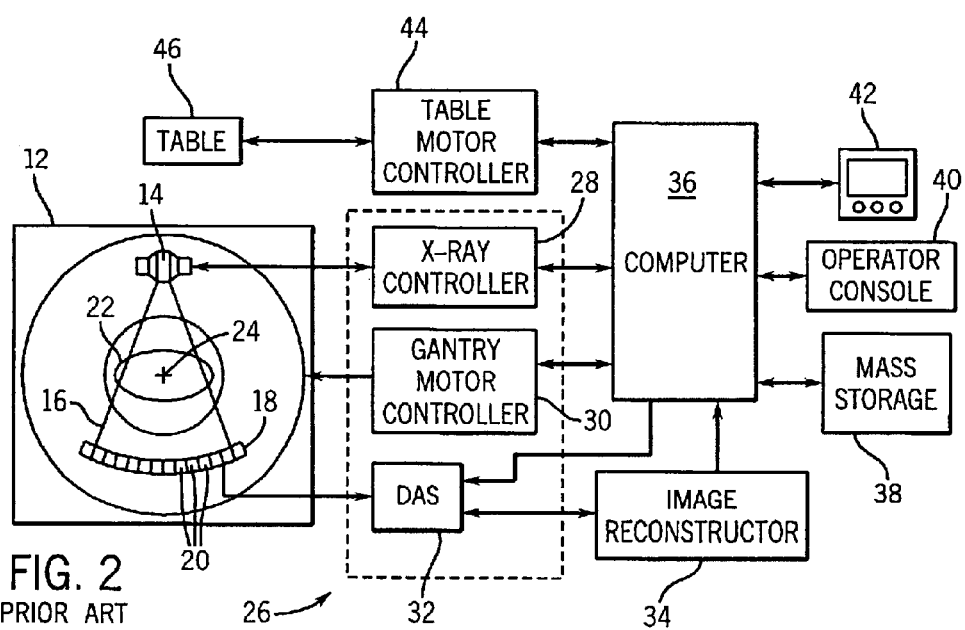
FIG. 2 is a block schematic diagram of the system illustrated in FIG. 1.

Referring to FIGS. 1 and 2, a computed tomography (CT) imaging system 10 is shown as including a gantry 12 representative of a "third generation" CT scanner. Gantry 12 has an x-ray source 14 that projects a beam of x-rays 16 toward a detector array 18 on the opposite side of the gantry 12. Detector array 18 is formed by a plurality of detectors 20 which together sense the projected x-rays that pass through a medical patient 22. Each detector 20 produces an electrical signal that represents the intensity of an impinging x-ray beam and hence the attenuated beam as it passes through the patient 22. During a scan to acquire x-ray projection data, gantry 12 and the components mounted thereon rotate about a center of rotation 24.

Rotation of gantry 12 and the operation of x-ray source 14 are governed by a control mechanism 26 of CT system 10. Control mechanism 26 includes an x-ray controller 28 that provides power and timing signals to an x-ray source 14 and a gantry motor controller 30 that controls the rotational speed and position of gantry 12. A data acquisition system (DAS) 32 in control mechanism 26 samples analog data from detectors 20 and converts the data to digital signals for subsequent processing. An image reconstructor 34 receives sampled and digitized x-ray data from DAS 32 and performs high speed reconstruction. The reconstructed image is applied as an input to a computer 36 which stores the image in a mass storage device 38.

Computer 36 also receives commands and scanning parameters from an operator via console 40 that has a keyboard. An associated cathode ray tube display 42 allows the operator to observe the reconstructed image and other data from computer 36. The operator supplied commands and parameters are used by computer 36 to provide control signals and information to DAS 32, x-ray controller 28 and gantry motor controller 30. In addition, computer 36 operates a table motor controller 44 which controls a motorized table 46 to position patient 22 and gantry 12. Particularly, table 46 moves portions of patient 22 through a gantry opening 48.

Figures 3, 4:
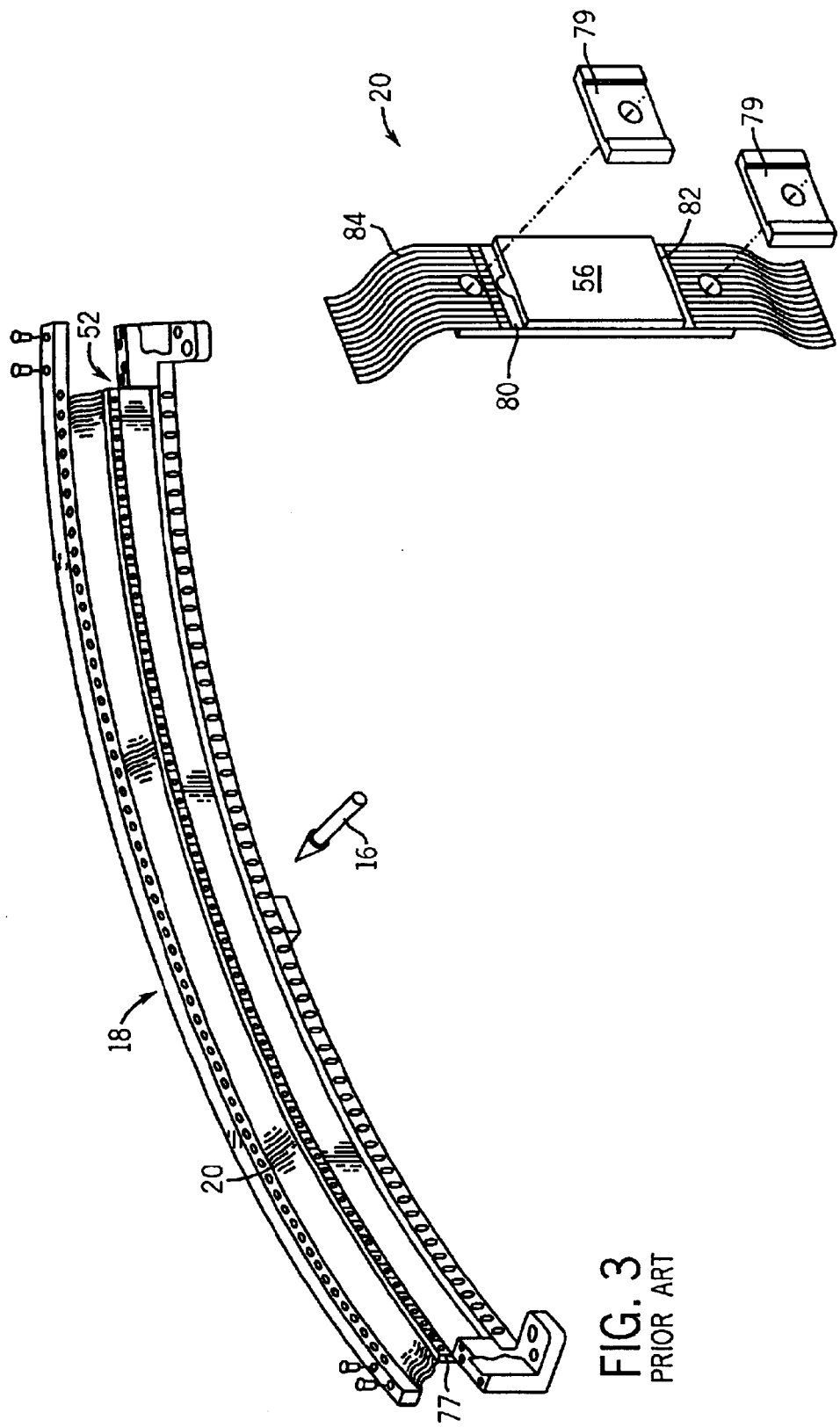
FIG. 3 is a perspective view of one embodiment of a CT system detector array.
FIG. 4 is a perspective view of one embodiment of a detector.

As shown in FIGS. 3 and 4, detector array 18 includes a plurality of scintillators 57 forming a scintillator array 56. A collimator (not shown) is positioned above scintillator array 56 to collimate x-ray beams 16 before such beams impinge upon scintillator array 56.

In one embodiment, shown in FIG. 3, detector array 18 includes 57 detectors 20, each detector 20 having an array size of 16×16. As a result, array 18 has 16 rows and 912 columns (16×57 detectors) which allows 16 simultaneous slices of data to be collected with each rotation of gantry 12.

Switch arrays 80 and 82, FIG. 4, are multi-dimensional semiconductor arrays coupled between scintillator array 56 and DAS 32. Switch arrays 80 and 82 include a plurality of field effect transistors (FET) (not shown) arranged as multi-dimensional array. The FET array includes a number of electrical leads connected to each of the respective scintillators and a number of output leads electrically connected to DAS 32 via a flexible electrical interface 84. Particularly, about one-half of scintillator outputs are electrically connected to switch 80 with the other one-half of scintillator outputs electrically connected to switch 82. Each detector 20 is secured to a detector frame 77, FIG. 3, by mounting brackets 79.

Switch arrays 80 and 82 further include a decoder (not shown) that control enables, disables, or combines scintillator outputs in accordance with a desired number of slices and slice resolutions for each slice. Decoder, in one embodiment, is a decoder chip or a FET controller as known in the art. Decoder includes a plurality of output and control lines coupled to switch arrays 80 and 82 and DAS 32. In one embodiment defined as a 16 slice mode, decoder enables switch arrays 80 and 82 so that all rows of the scintillator array 52 are activated, resulting in 16 simultaneous slices of data for processing by DAS 32. Of course, many other slice combinations are possible. For example, decoder may also select from other slice modes, including one, two, and four-slice modes.

Figure 5:
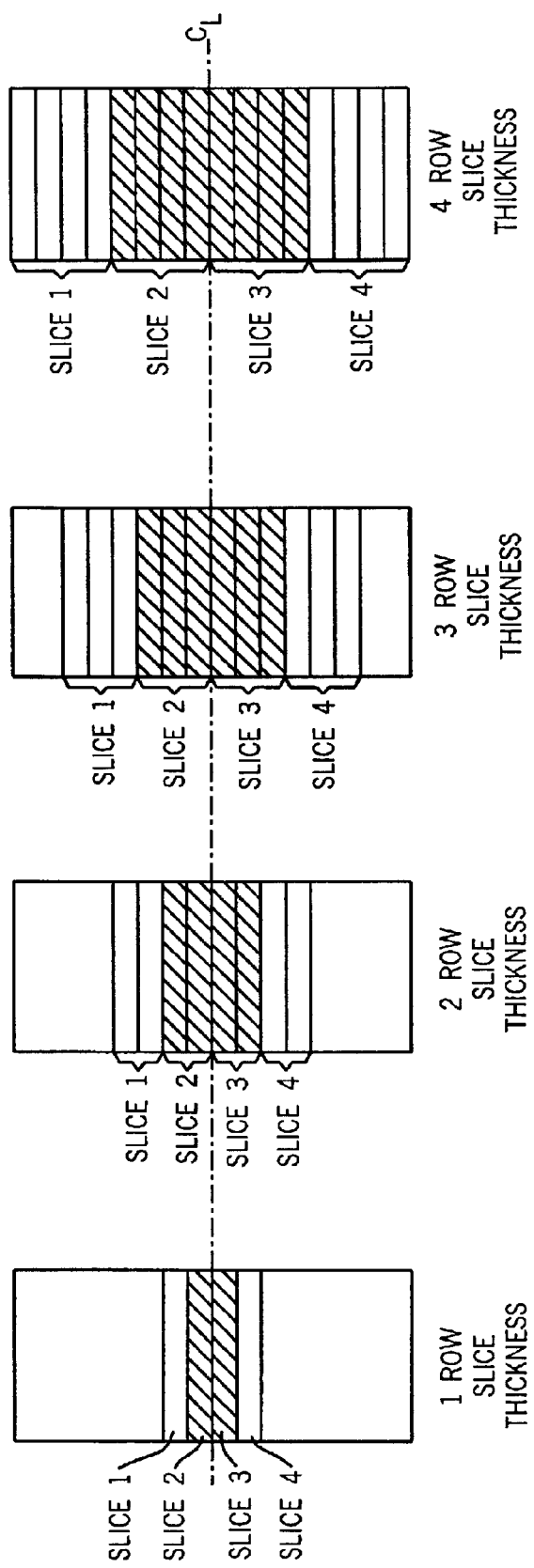
FIG. 5 is illustrative of various configurations of the detector in FIG. 4 in a four-slice mode.

As shown in FIG. 5, by transmitting the appropriate decoder instructions, switch arrays 80 and 82 can be configured in the four-slice mode so that the data is collected from four slices of one or more rows of scintillator array 56. Depending upon the specific configuration of switch arrays 80 and 82, various combinations of scintillators 57 can be enabled, disabled, or combined so that the slice thickness may consist of one, two, three, or four rows of scintillator array 57. Additional examples include, a single slice mode including one slice with slices ranging from 1.25 mm thick to 20 mm thick, and a two slice mode including two slices with slices ranging from 1.25 mm thick to 10 mm thick. Additional modes beyond those described are contemplated.

Figure 6:
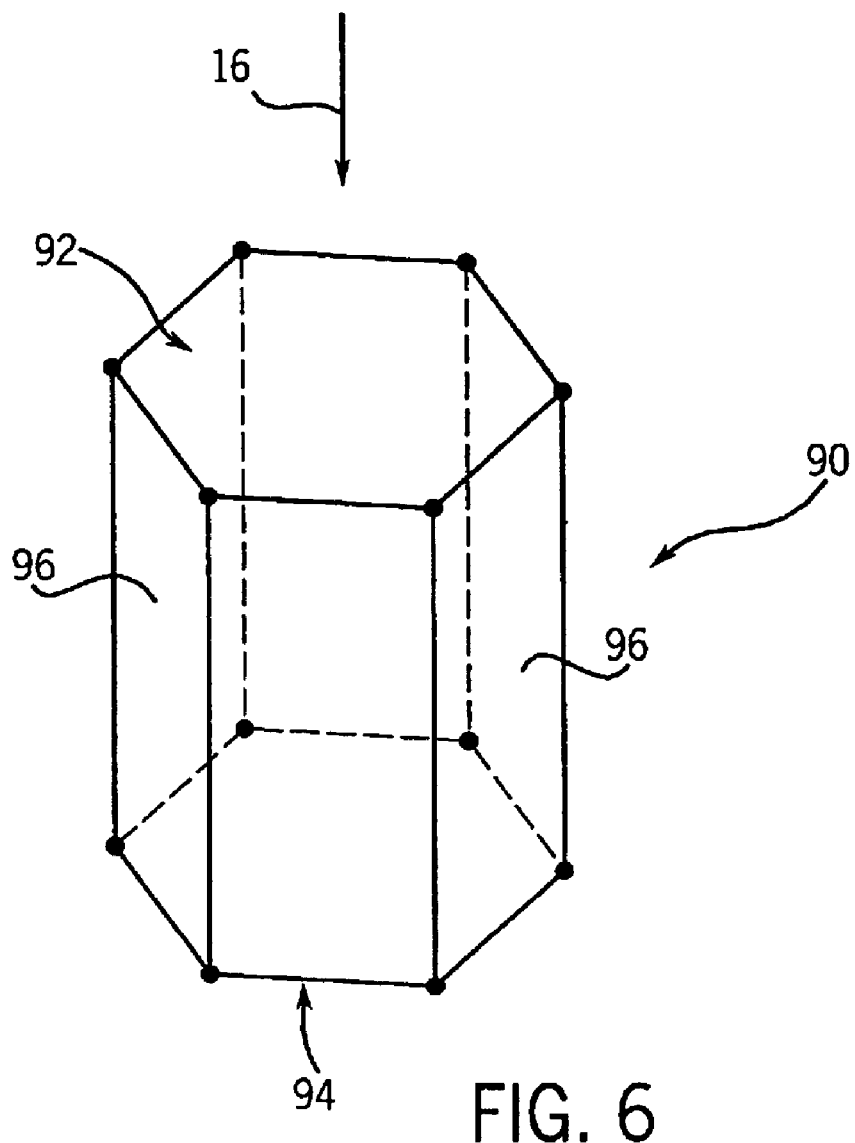
FIG. 6 is a perspective view of a crystallite according to one embodiment of the present invention.

Now referring to FIG. 6, and in a preferred embodiment, each scintillator comprises a plurality of crystallites 90. The present invention will be described with respect to the hexagonal crystalline structure 90 shown in FIG. 6, however, one of ordinary skill in the art will appreciate that the present invention is equally applicable to other polygonal crystalline structures. Each crystallite 90 includes a receiving surface 92 and a exiting surface 94. In the hexagonal crystalline structure 90 shown, six surface walls generally designated 96 are provided connecting the receiving surface 92 and the exiting surface 94. As shown, the surface walls 96 are configured perpendicular at approximately 90° to both the receiving surface 92 and the exiting surface 94. By configuring the surface walls 96 perpendicularly to the receiving surface 92 and the exiting surface 94, the receiving surface 92 and the exiting surface 94 are arranged parallel to one another along a constant plane. Furthermore, the receiving surface 92 and the exiting surface 94 are configured perpendicular to beam of x-rays 16 and the surface walls 96 are arranged parallel to the beam of x-rays 16. Orientating receiving surface 92 and exiting surface 94 perpendicular to x-ray beam 16 and orientating surface walls 96 parallel to x-ray beam 16, light scattering in the scintillator is reduced while increasing the overall efficiency of the scintillator and CT system.

Accordingly, the present invention contemplates a method of aligning scintillator crystallites for a computed tomography imaging system. The method includes melting a composition configured to convert high frequency electromagnetic energy to light energy, and in a preferred embodiment, into a glass melt. The glass melt is then configured into one of a number forms, such as, a layered form, a laminated form, or a columnated form. Crystal seeds, a few nanometers in size, are then deposited inside the glass melt and grown to form a crystalline phase. The growing crystallites will share the same polygonal structure, but will not be uniformly aligned. As a result, the method includes the step of applying a field to the glass melt while growing the crystallites. In one preferred embodiment, the field is an electric field wherein a bias voltage is applied across the glass melt. The electric field applied across the glass melt will align the crystallites in a uniform direction. This is achieved because each crystallite of the glass melt has a dipole moment, therefore, one surface 92, 94 will orientate with the positive voltage and the other surface 94, 92 will align with the negative voltage. As the crystallites are grown, each new crystallite structure will be properly orientated until each crystallite structure is formed and the bulk material will become a glass ceramic. The electric field will be maintained across the glass ceramic after the growing phase ceases and subsequent cooling of the glass ceramic. When the glass ceramic has cooled, the electric field is removed and a uniformly aligned and properly orientated scintillator results.

Alternatively, the crystallites may be uniformly aligned and orientated by applying a magnetic field, an electromagnetic field, an optical field, a thermal field, or a mechanical stress to the glass melt.

The present invention further includes a method of CT imaging including the steps of providing a plurality of scintillators forming a scintillator array wherein each scintillator includes a plurality of crystallites. The crystallites are then aligned in a uniform direction to receive high frequency electromagnetic energy from a projection source. In a preferred embodiment, the high frequency electromagnetic energy is x-ray energy, but the instant invention is applicable with other forms of high frequency electromagnetic energy. The high frequency electromagnetic energy directed toward the scintillator array is received and converted to light energy. In a preferred embodiment, a photodiode array comprising a plurality of photodiodes and optically coupled to the scintillator array detects the light energy emitted by each scintillator of the scintillator array and transmits signals indicative of light energy intensity to a data acquisition system whereupon the signals are analyzed and a CT image is generated.

The present invention further includes a CT system that has a plurality of scintillators including a plurality of uniformly aligned crystallites. A high frequency electromagnetic energy projection source is configured to project a high frequency electromagnetic energy beam toward the plurality of scintillators. In a preferred embodiment, the high frequency electromagnetic energy beam is an x-ray beam. The system further includes a photodiode array having a plurality of photodiodes optically coupled to the plurality of scintillators to receive light energy output therefrom and a gantry having an opening to receive a subject object, such as a medical patient.

Each uniformly aligned crystallite of each scintillator includes a receiving surface, an exiting surface, and a plurality of surface walls connecting the receiving surface and the exiting surface. In the hexagonal crystalline structure shown in FIG. 6, six surface walls connect the receiving and exiting surfaces. However, the instant invention is further applicable to other polygonal crystalline structures. Regardless of the particular polygonal crystalline structure, each surface wall is configured perpendicularly to the receiving surface and the exiting surface. As a result, the receiving surface and the exiting surface are co-planar and are configured perpendicularly to the high frequency electromagnetic energy beam. Moreover, the plurality of surface walls are configured parallel to the high frequency electromagnetic energy beam.

The present invention has been described in terms of the preferred embodiment, and it is recognized that equivalents, alternatives, and modifications, aside from those expressly stated, are possible and within the scope of the appending claims.

What is claimed is:

1. A CT system comprising:
    a plurality of scintillators including a plurality of uniformly aligned crystallites, the plurality of uniformly aligned crystallites being aligned by application of one of an electric field and a magnetic field across a melt in which the the plurality of uniformly aligned crystallites is grown;
    a high frequency electromagnetic energy projection source configured to project a high frequency electromagnetic energy beam toward the plurality of scintillators;
    a photodiode array having a plurality of photodiodes optically coupled to the plurality of scintillators to receive light energy output therefrom; and
    a gantry having an opening to receive a subject to be scanned.

2. The CT system of claim 1 wherein each uniformly aligned crystalline structure includes a receiving surface, an exiting surface, and a plurality of surface walls connecting the receiving surface and the exiting surface, wherein the receiving surface and the exiting, surface are coplanar.

3. The CT system of claim 2 wherein each surface wall is configured perpendicularly to the receiving surface and the exiting surface.

4. The CT system of claim 2 wherein the receiving surface and the exiting surface are configured perpendicularly to the high frequency electromagnetic energy beam and the plurality of surface walls are configured parallel to the high frequency electromagnetic energy beam.

5. The CT system of claim 1 wherein the at least one scintillator is a glass ceramic.

6. The CT system of claim 1 wherein the plurality of scintillators produce light energy having an intensity indicative of high frequency electromagnetic energy beam attenuation by the subject.

7. The CT system of claim 1 wherein the subject is a patient and the high frequency electromagnetic beam is an x-ray beam.

8. The CT system of claim 1 wherein each of the plurality of uniformly aligned crystallite has a polygonal crystalline structure.

9. The CT system of claim 1 wherein each of the plurality of uniformly aligned crystallites has a hexagonal crystalline structure.

10. A method for orientating crystallites in CT scintillators comprising the steps of:
    melting a composition configured to convert high frequency electromagnetic energy to light energy into a glass melt;
    shaping the glass melt;
    depositing crystal seeds inside the glass melt;
    growing crystallites in the glass melt from the crystal seeds; and
    applying a field to the glass melt while growing the crystallites.

11. The method of claim 1 further comprising the step of aligning the crystallites in a uniform orientation.

12. The method of claim 1 wherein the step of applying a field includes applying one of an electric field, a magnetic field, an electromagnetic field, an optical field, a thermal field, and a mechanical stress.

13. The method of claim 11 further comprising the step of configuring the crystallites parallel to a high frequency electromagnetic energy path.

14. The method of claim 1 wherein the step of shaping includes one of layering, laminating, and columnating the glass melt.

15. A CT system comprising a scintillator array having a plurality of uniformly aligned scintillators, each of the scintillators having a plurality of crystallites, the crystallites formed by:
    melting a composition configured to convert high frequency electromagnetic energy to light energy into a glass melt;

precipitating crystal seeds into the glass melt;

growing a crystalline phase from the crystal seeds; and applying an aligning field, including one of an electric field, a magnetic field, an electromagnetic field an optical field, a thermal field and a mechanical stress to the glass melt during the growing of the crystalline phase.

16. The CT system of claim 15 wherein the plurality of crystallites is further formed by maintaining the aligning field across the glass melt after the growing of the crystalline phase.

17. The CT system of claim 16 wherein the plurality of crystallites is further formed by maintaining the aligning field across the glass melt during cooling of the glass melt.

18. The CT system of claim 15 wherein the plurality of crystallites is further formed by shaping the glass melt into one of a layered form, a laminated form, and a columnated form.

19. The CT system of claim 15 wherein applying the aligning field includes applying a bias voltage across the glass melt.

20. The CT system of claim 15 wherein growing the crystalline phase includes growing a plurality of crystallites from the crystal seeds.

21. The CT system of claim 20 wherein the plurality of crystallites is further formed by parallelly aligning the plurality of crystallites.

22. The CT system of claim 20 wherein the plurality of crystallites is further formed by crystallizing the glass melt and enlarging the deposited crystals to form a crystalline phase.

23. The CT system of claim 22 wherein the plurality of crystallites is further formed by applying one of an electric field and a magnetic field across the glass melt during the crystallization step.

24. The CT system of claim 23 wherein the plurality of crystallites is further formed by applying the electric field to a ferroelectric crystalline phase and the magnetic field to a ferromagnetic crystalline phase.

25. The method of claim 1 further comprising the step of improving light collecting efficiency of the scintillators.

26. The method of claim 1 further comprising the step of eliminating external light cladding.

27. The method of claim 1 wherein each of the crystallites has a polygonal crystalline structure.

28. The method of claim 27 wherein each of the crystallites has a hexagonal crystalline structure.

* * * * *